United States Patent [19]

Muramatsu et al.

[11] Patent Number: 4,642,412

[45] Date of Patent: Feb. 10, 1987

[54] PHOTO-ELECTRONIC CONVERSION APPARATUS WITH LIGHT PATTERN DISCRIMINATOR

[75] Inventors: Shinichi Muramatsu, Higashiyamato; Toshikazu Shimada, Kokubunji; Sunao Matsubara, Tokorozawa; Haruo Itoh, Hino; Nobuo Nakamura, Hachioji, all of Japan

[73] Assignee: Hitachi, Ltd., Tokyo, Japan

[21] Appl. No.: 759,961

[22] Filed: Jul. 29, 1985

[30] Foreign Application Priority Data

Jul. 27, 1984 [JP] Japan ................. 59-155256

[51] Int. Cl.⁴ .................. H01L 25/02; H01L 27/14
[52] U.S. Cl. ............................. 136/244; 136/291
[58] Field of Search ................. 136/244, 291, 293

[56] References Cited

U.S. PATENT DOCUMENTS 3,672,999  6/1972  Barbera ................. 136/245
3,925,103 12/1975  Russell ................. 136/202
4,456,782  6/1984  Nishiura et al. ........ 136/244

Primary Examiner—Aaron Weisstuch
Attorney, Agent, or Firm—Antonelli, Terry & Wands

[57] ABSTRACT

A plurality of photovoltaic devices (e.g., solar cells) connect with each other and form a photo-electric conversion apparatus. The photovoltaic devices concerned are so connected with each other that when a given pattern of light is irradiated upon the photo-electric conversion apparatus concerned, the electrical output generated when the whole of it is irradiated is smaller than that generated when some parts of it are irradiated. Since an electronic system equipped with this apparatus as a power supply can be designed to work when the apparatus is irradiated with such a pattern of light that irradiates only a part of the apparatus, an electronic system having such an identifying faculty can be made easily.

Further, an apparatus like this type may be made by connecting the elements of this apparatus in series or in reverse direction to form units, and by connecting this plurality of units in series and/or in parallel.

8 Claims, 6 Drawing Figures 4,642,412

PHOTO-ELECTRONIC CONVERSION APPARATUS WITH LIGHT PATTERN DISCRIMINATOR

BACKGROUND OF THE INVENTION

This invention relates to a photo-electric conversion apparatus which generates electricity when irradiated by light and more particularly relates to a photo-electric conversion apparatus which is designed to generate an electric output corresponding to a previously established pattern of light applied thereto.

Conventional photo-electric apparatuses have had a plurality of photovoltaic devices (e.g., thin-film solar cells) formed on substrates and connected electrically in series, which are exemplified in Japanese Patent Publication No. 54,513/1983 and U.S. Pat. No. 4,042,418.

By employing that form of connection, they generate the electric output required for operating electronic apparatuses.

SUMMARY OF THE INVENTION

It is an object of this invention to readily increase the operating efficiency of a coded card, such as a cash card or identification card, by giving a discrimination faculty to a photo-electronic conversion apparatus which is incorporated as a power supply in such a recognition card containing an IC or LSI.

To this end, this invention presents an apparatus which is, by using a plurality of photovoltaic devices, so connected as to generate less electric output when all of the devices are irradiated than is generated when only some of them are irradiated. An electronic apparatus having such photovoltaic devices as a power supply works only when it receives irradiation of light rays forming a particular pattern that cuase higher electric output of the photovoltaic devices. Thus an apparatus of this kind allows easy detection of whether or not it is working correctly.

Further, a connection of this kind can be easily made by connecting in series or parallel a plurality of units which consist of devices connected in parallel and in reverse direction.

DETAILED DESCRIPTION OF THE INVENTION

Figure 1A:
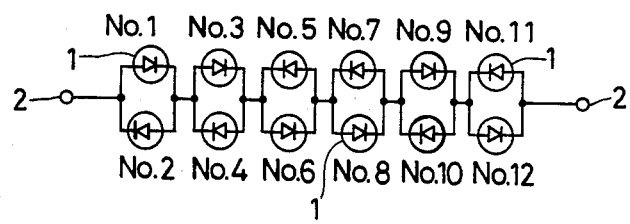
FIGS. 1a–1c illustrate basic arrangements which may be employed in the practice of this invention.

One of the basic arrangements of this invention is illustrated in FIG. 1a. Photovoltaic devices 1 are respectively given numbers from 1 to 12. The photovoltaic devices No. 1 and No. 2 are connected together in parallel and in reverse direction. It can be easily understood that with this sort of connection there is no electric output when both the photovoltaic devices No. 1 and No. 2 are irradiated over the whole of their surfaces. A pair of photovoltaic devices connected in this way is hereinafter referred to as "a unit". Photovoltaic devices No. 3 and No. 4, No. 5 and No. 6, No. 7 and No. 8, No. 9 and No. 10, and No. 11 and No. 12 also respectively compose units and are connected in series. In this form of connection, if all of these photovoltaic devices are irradiated, the circuit generates no voltage between terminals 2. And the largest electric output between terminals 2 occurs at the time when all of devices connected in the same direction of polarity are irradiated.

Since the electric output varies in dependence upon which of the photovoltaic devices are irradiated, it is conversely possible to identify the pattern of light by detecting the electric output. Thus some patterns of light will generate a sufficiently large electric output for an electronic apparatus to be operated.

Consequently, a cash card incorporated with the photoelectric conversion apparatus of this invention has a discriminating faculty that allows users to employ it only in a cash dispenser having a particular irradiating pattern. This discriminating faculty does not have the defect of being influenced by a magnetic field as in the case of maintaining records by magnetic recording, nor does it have the disadvantage of disappearing when the power supply is cut off as in the case of a semiconductor memory. This faculty is in contrast simple, and has high reliability.

Figure 1B:
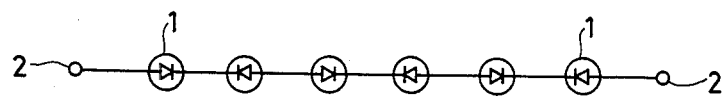
Figure 1C:
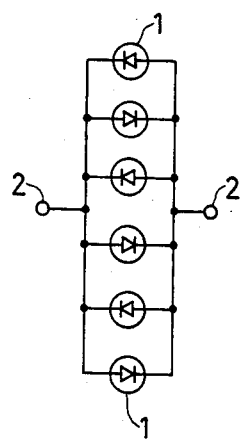

Other basic arrangements of this invention are respectively illustrated in FIGS. 1b and 1c.

Each unit may be composed of more than two photovoltaic devices. As a matter of course, there will be no problem even if the characteristics of the devices are different from each other.

Moreover, the photo-electric conversion apparatus of this invention can, of course, be incorporated in any kind of electronic system, as well as in ID cards and cash cards provided with electronic devices such as ICs, LSIs, etc.

Further, since the photovoltaic devices employed in this invention are so-called "solar cells" made from Si, GaAs, amorphous Si, etc, it is also possible to dispose a multiplicity of units on a single substrate.

This photo-electric conversion apparatus can, of course, be used as a power supply for electronic systems, or it can be applied to them merely as an identifying apparatus.

On connecting the units, resistances, diodes, etc. can also be connected to them, according to need. It is possible for each unit itself to include electronic elements such as resistances, diodes, etc. in addition to the solar cells.

It is possible, according to this invention, to provide a photo-electric conversion apparatus (e.g., so-called solar cells) having a discriminating faculty for a pattern of irradiated light which will popularize the electronic systems equipped with such a low-cost discriminating faculty, and have a tremendous influence upon the current momentum toward the so-called "information society".

Example

Figure 2:
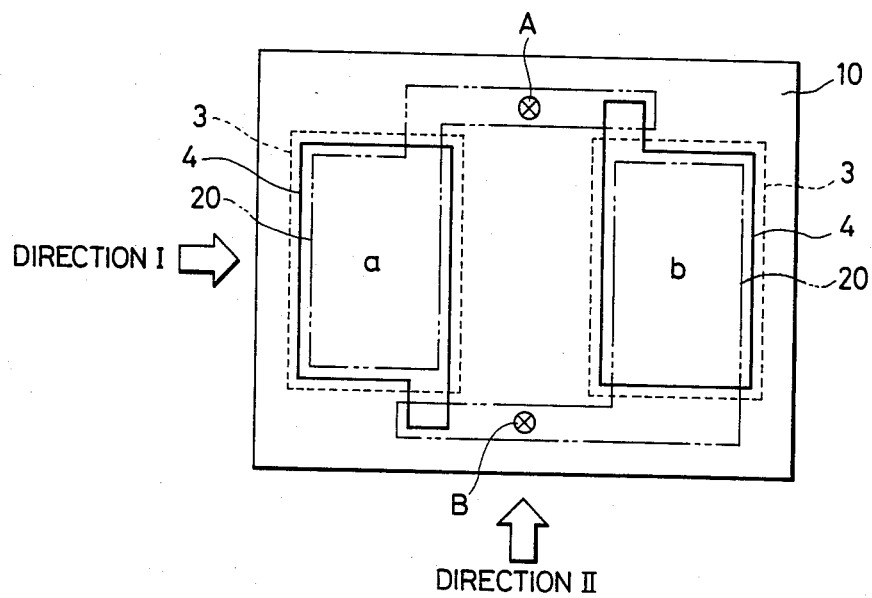
FIG. 2 illustrates the embodiment of this invention.

FIG. 2 is a plan view of a unit consisting of two photovoltaic devices.

Figure 3A:
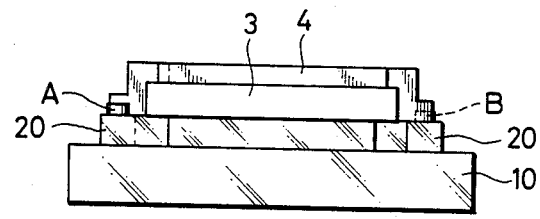
FIGS. 3a–3b are side views of the apparatus shown in FIG. 2.

FIG. 3(a) is a side elevation as viewed in the direction indicated by the arrow I of FIG. 2.

Figure 3B:
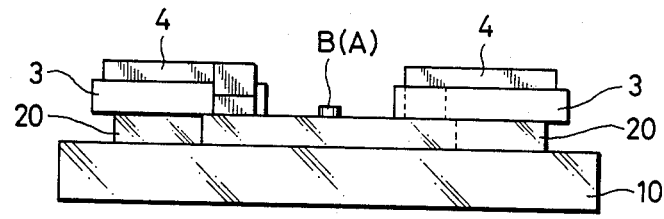

FIG. 3(b) is a side elevation as viewed in the direction indicated by the arrow II of FIG. 2.

A transparent electrode 20 is formed using conductive glass. Next amorphous Si layer 3 is formed, consisting of three layers: p-type, intrinsic, and n-type layers; the respective film thickness of these layers are 100 Å, 5000 Å, and 300 Å. Electrodes 4 are formed on the layer 3. The points A and B thereon are terminals for connection to other units.

Five units each having the above-described construction are connected with each other in the manner shown in FIG. 1. These units generate electric output-0.03 V when all of them are irradiated, and 3.2 V when one side of each of them is irradiated, each side having the same polarity.

What is claimed is:

1. A photo-electric conversion apparatus comprising light pattern discriminating means including a plurality of photovoltaic devices which are so connected electrically that when all of said photovoltaic devices are exposed to uniform light, the electric output is smaller than when all of said photovoltaic devices are exposed to light forming a predetermined pattern wherein a portion of all of said photovoltaic devices is illuminated and at least one other portion of said photovoltaic devices is non-illuminated at the same time in accordance with the predetermined light pattern.

2. A photo-electric conversion apparatus according to claim 1, wherein some of said photovoltaic devices are connected in parallel and in reverse direction to form a plurality of units which are connected with each other in series and/or in parallel.

3. A photo-electric conversion apparatus according to claim 1, wherein said photovoltaic devices are connected in such a manner that said apparatus is able to generate no electric output, or substantially none, when all of said photovoltaic devices are illuminated.

4. A photo-electric conversion apparatus according to claim 1, wherein some or all of said plurality of photovoltaic devices are formed on a single substrate.

5. A photo-electric conversion apparatus according to claim 4, wherein when all of said photovoltaic devices are exposed to uniform light, the electric output of the photo-electric conversion apparatus is substantially zero.

6. A photo-electric conversion apparatus according to claim 1, wherein the electric output of the photo-electric conversion apparatus serves as a power supply for an electric device, and when all of said photovoltaic devices are exposed to uniform light, the electric output of the photo-electric conversion apparatus is insufficient to enable operation of the electric device.

7. A photo-electric conversion apparatus according to claim 6, wherein said photovoltaic devices and said electric device form part of a card member.

8. A photo-electric conversion apparatus according to claim 1, wherein when all of said photovoltaic devices are exposed to uniform light, the electric output of the photo-electric conversion apparatus is substantially zero.

* * * * *